(12) United States Patent
Chen et al.

(10) Patent No.: US 6,520,669 B1
(45) Date of Patent: Feb. 18, 2003

(54) FLEXIBLE SUBSTRATE MOUNTED SOLID-STATE LIGHT SOURCES FOR EXTERIOR VEHICULAR LIGHTING

(75) Inventors: James C. Chen, Bellevue, WA (US); Darrin Huston, Enumclaw, WA (US)

(73) Assignee: Light Sciences Corporation, Snoqualmie, WA (US)

(*) Notice: Subject to any disclaimer, the term of this patent is extended or adjusted under 35 U.S.C. 154(b) by 9 days.

(21) Appl. No.: 09/597,931

(22) Filed: Jun. 19, 2000

(51) Int. Cl.[7] .......................................... F21W 101/14
(52) U.S. Cl. ................... 362/545; 362/549; 362/499; 362/231; 362/237; 362/219; 362/800; 313/511
(58) Field of Search .................... 362/545, 549, 362/499, 287, 487, 231, 237, 245, 259, 219, 800; 313/511

(56) References Cited

U.S. PATENT DOCUMENTS

| | | | |
|---|---|---|---|
| 4,774,434 A | | 9/1988 | Bennion ...................... 313/500 |
| 5,103,382 A | | 4/1992 | Kondo et al. ............... 362/80.1 |
| 5,162,696 A | * | 11/1992 | Goodrich ..................... 313/511 |
| 5,559,681 A | * | 9/1996 | Duarte ......................... 362/252 |
| 5,848,837 A | * | 12/1998 | Gustafson ................... 362/235 |
| 5,895,115 A | * | 4/1999 | Parker et al. ............... 362/511 |
| 5,926,320 A | * | 7/1999 | Parkyn, Jr. et al. .......... 359/641 |
| 5,931,577 A | * | 8/1999 | Ishibashi ..................... 362/249 |
| 6,005,692 A | | 12/1999 | Stahl ............................ 359/15 |
| 6,016,038 A | | 1/2000 | Mueller et al. ............. 315/291 |
| 6,250,788 B1 | * | 6/2001 | Muller ........................ 362/499 |

* cited by examiner

*Primary Examiner*—Thomas M. Sember
*Assistant Examiner*—James W Cranson, Jr.
(74) *Attorney, Agent, or Firm*—Ronald M. Anderson

(57) ABSTRACT

Exterior lighting assemblies for use on vehicles include a flexible substrate on which are mounted a plurality of solid-state light emitting devices. Preferably, light emitting diodes (LEDs) are used for the solid-state light emitting devices, although other types of devices can alternatively be employed. The light emitting devices are connected to flexible conductive traces provided on the flexible substrate and leads are provided to connect to the power supply on the vehicle so that electrical current can be selectively supplied to energize the light emitting devices. The flexible substrate is adapted to be mounted on the exterior surface of a vehicle, for example, as a tail lamp assembly, or as a headlamp. Light emitting devices that emit different colored light can be used to provide red light to indicate slowing of the vehicle due to braking, amber light for turn signal indication, and white light to illuminate the surface over which the vehicle is traveling. A flexible optically transparent cover protects the light emitting devices. Due to their flexibility, the light assemblies can be conformed around a curved exterior surface of a vehicle.

26 Claims, 5 Drawing Sheets

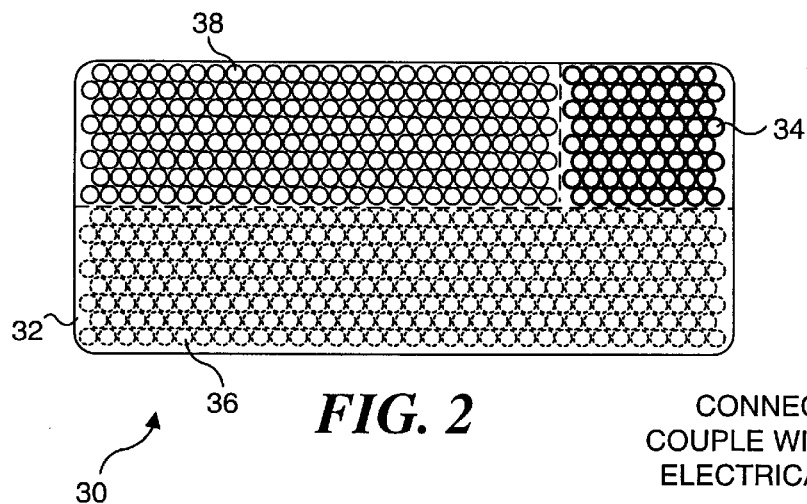
FIG. 2
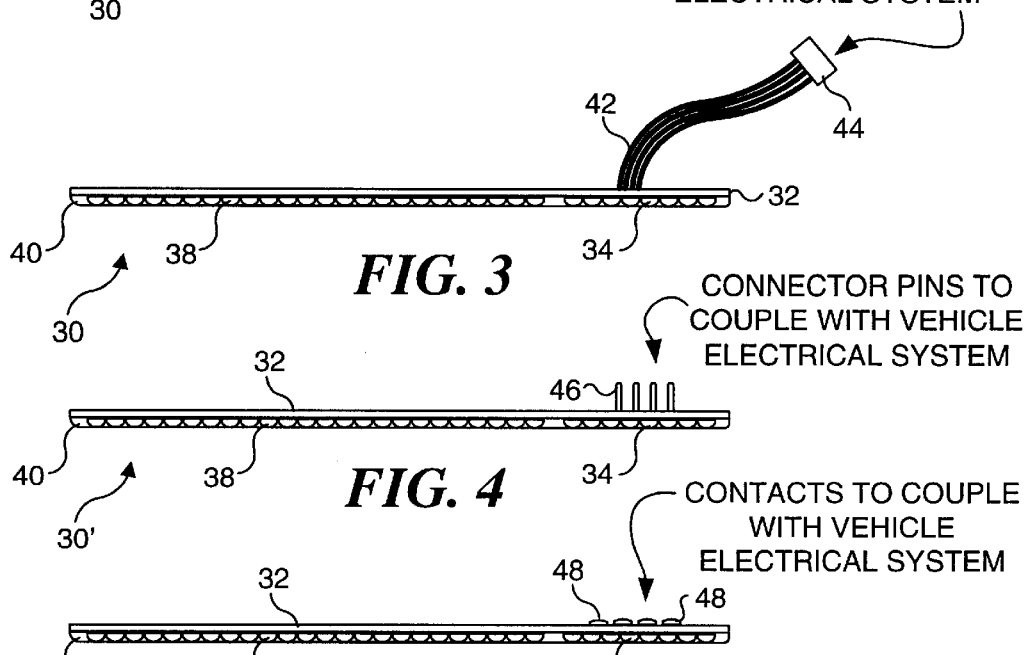
FIG. 3
FIG. 4
FIG. 5
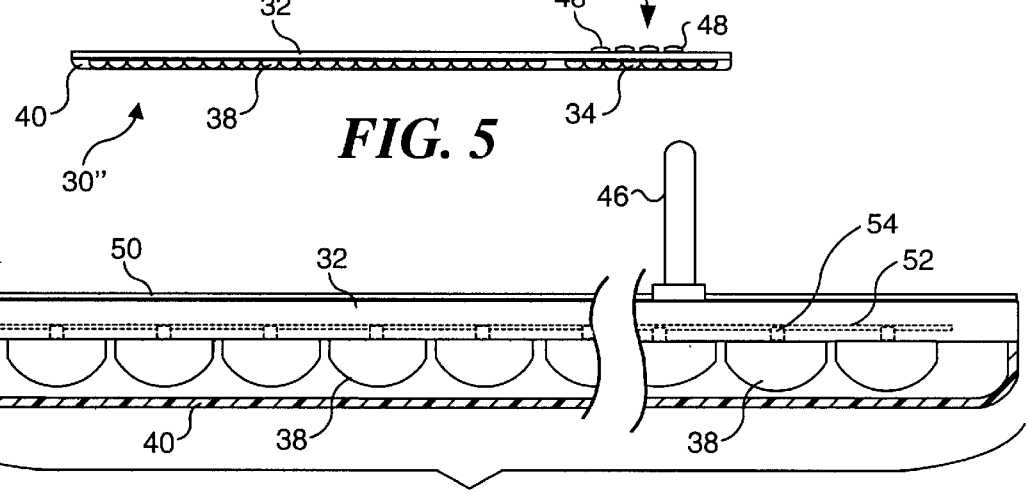
FIG. 6

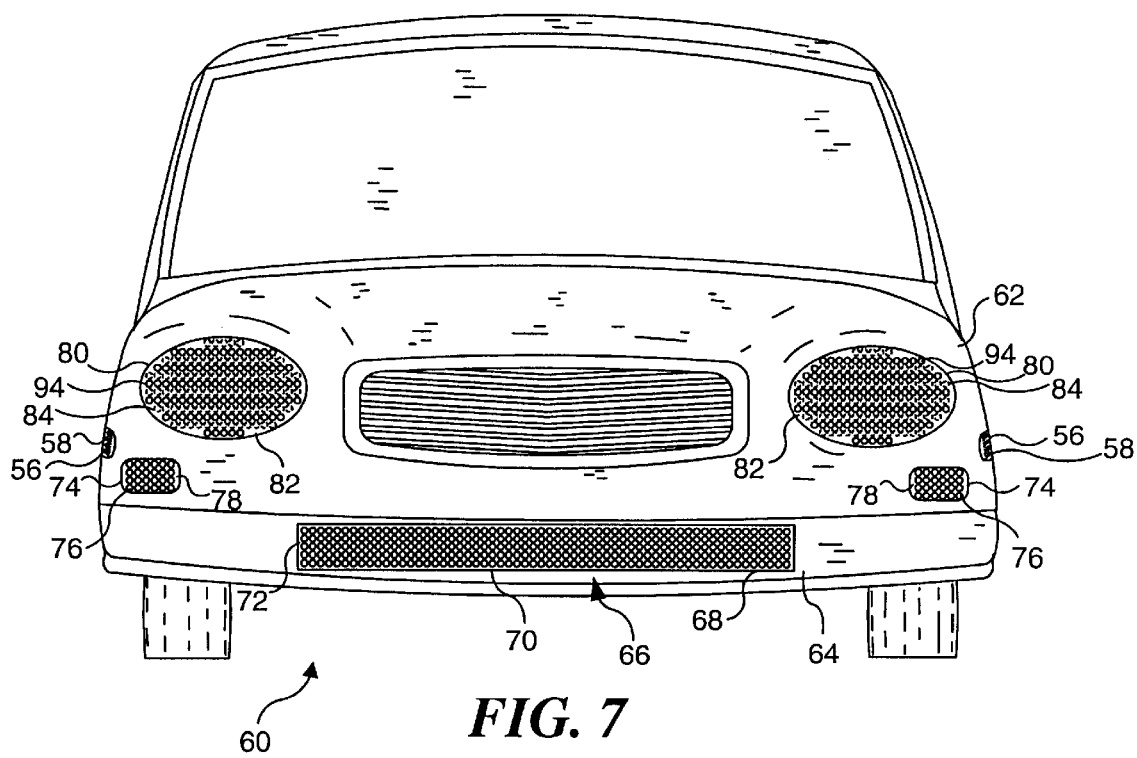
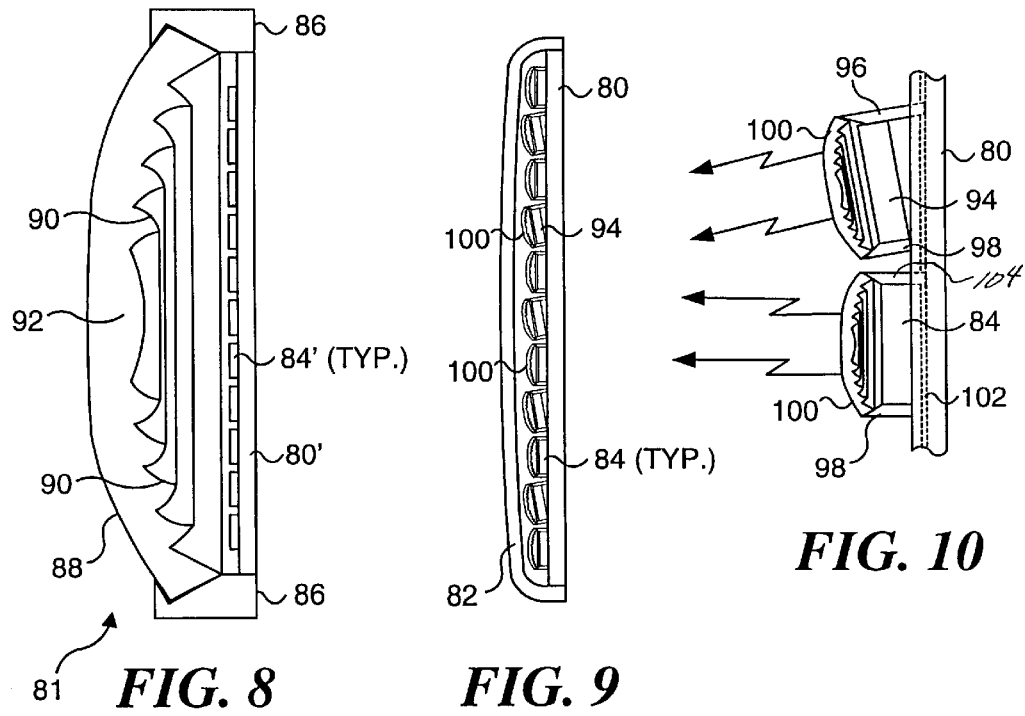
FIG. 7
FIG. 8  FIG. 9  FIG. 10

FLEXIBLE SUBSTRATE MOUNTED SOLID-STATE LIGHT SOURCES FOR EXTERIOR VEHICULAR LIGHTING

FIELD OF THE INVENTION

The present invention generally pertains to lighting for use on a vehicle, and more specifically, to exterior lighting provided by light emitting diodes (LEDs) or other solid-state light sources that are mounted on a flexible substrate, for use on the rear and/or the front of a vehicle.

BACKGROUND OF THE INVENTION

Exterior lighting for automobiles and other types of motorized and non-motorized vehicles typically includes one or more incandescent lamps that include a tungsten filament. This filament is turned white hot by an electrical current that flows through it. Because such lamps produce considerable heat, they typically burn out after only a few hundred hours of use, and are much less efficient than other types of light sources. On vehicle tail light and head light assemblies, a curved reflective surface is usually included behind the bulb to ensure that sufficient light intensity is directed in a desired direction. The reflective surfaces for incandescent tail lights, brake lights, and backup lights used on the rear of vehicles often require several inches of depth. As a result, the lighting assemblies at each side on the rear of a vehicle must intrude into the vehicle trunk by the required depth of the assembly and its reflective mounting for the incandescent lamps that are used therein. The volume required for the lighting assemblies within the trunk is substantial and is unavailable for storing objects placed into the trunk.

Each model of vehicle typically requires a different rear light assembly to accommodate the specific shape of the exterior surface in which the rear light assemblies are mounted. The colored plastic lenses used for these assemblies are relatively expensive, easily broken in even low-speed collisions with objects, and expensive to replace. Because each make and model of vehicle typically uses a different rear light assembly lens, it is expensive to maintain a stock of these parts and after a few years, they become unavailable from a dealer and can often only be obtained from wrecking yards.

Many of the same problems arise in connection with head lights, running lights, parking lights, and turn signals used on the front and sides of vehicles. The orientation of conventional head lights must be adjusted so that the light they emit primarily illuminates the lane of traffic in which the vehicle is traveling, is directed downwardly at the road surface, and does not blind drivers of oncoming vehicles in an adjacent lane. Improperly adjusted head lights contribute to accidents caused by poor illumination of the road surface and/or glare that distracts a driver of an oncoming vehicle.

Accordingly, it would be preferable to provide a non-incandescent light source that does not use a conventional bulb for exterior vehicle lighting. Such a light source should ideally be sufficiently flexible to conform to a curved exterior shape of a vehicle, and minimize the need to provide a different assembly for each different model and make of vehicle. Also, these light sources should not require any significant depth, but instead should be mountable on the exterior surface of a vehicle, requiring almost no internal volume in the trunk, engine compartment, or sidewalls of the vehicle. Light sources should have an expected lifetime of many thousands of hours, e.g., for the life of the vehicle. If damaged, these light sources should be replaceable at relatively low cost. Furthermore, any capability required for focusing or directing the light emitted by the sources in a desired direction should be included with the light sources and should require little additional depth.

SUMMARY OF THE INVENTION

In accord with the present invention, a flexible vehicular lighting assembly is defined. The lighting assembly is adapted to mount on and conform to an external surface of a vehicle. Depending upon the configuration of the lighting assembly, it can provide illumination of a surface over which the vehicle is traveling, indicate an intention of a driver to turn the vehicle in a specific direction, stop the vehicle, and/or provide an indication of a location of the vehicle. The lighting assembly includes a flexible substrate having a rear surface and a front surface. A plurality of flexible conductive traces are disposed on the flexible substrate and are adapted to connect to an electrical system of a vehicle to receive an electrical current. In addition, a plurality of solid-state light emitting devices are mounted in a spaced-apart array on the flexible substrate and are electrically connected to the plurality of flexible conductive traces so that these sources can be energized by the electrical current, causing the them to emit light. A transparent flexible envelope extends over the plurality of solid-state light emitting devices, providing protection against abrasion, but enabling the light emitted by the plurality of solid-state light emitting devices to pass through the transparent flexible envelope. The rear surface of the flexible substrate is adapted to seat against and conform to an exterior surface of a vehicle.

Furthermore, in one embodiment, the flexible vehicular light assembly preferably includes a plurality of reflective surfaces, each disposed around a different one of the plurality of solid-state light emitting devices. These reflective surfaces focus the light emitted by the plurality of solid-state light emitting devices in a desired direction, away from the front surface of the flexible substrate.

In one embodiment, an adhesive is applied to the rear surface of the flexible substrate for use in adhesively attaching the flexible substrate to an exterior surface of a vehicle. If desired, the flexible substrate can be attached to the vehicle in a shallow recess formed on the outer surface of the vehicle.

Depending upon the desired application, the plurality of solid-state light emitting devices are preferably arrayed in a plurality of groups, and those in each group emit light of a different color than the devices in the other groups. For example, the solid-state light emitting devices in a first group may emit white light, the devices in a second group may emit red light, and those in a third group may emit amber light. This type of vehicular light assembly is preferably adapted to mount on a rear portion of a vehicle, adjacent to one side, to selectively emit the amber light and when periodically energized (blinking), indicating a direction in which the vehicle will turn, the red light being emitted for indicating that the vehicle is slowing, and the white light to illuminate a ground surface over which the vehicle is backing.

In another configuration, the plurality of light emitting devices emit white light, and the flexible vehicular light assembly is adapted to be mounted on a front exterior surface of a vehicle, to illuminate a surface over which the vehicle may advance.

Another preferred form of the flexible vehicular light assembly further includes a totally internally reflective (TIR)

lens for each of the plurality of solid-state light emitting devices. The TIR lenses focus the light emitted by the plurality of solid-state light emitting devices away from the front surface, in a desired direction. Yet another embodiment includes a TIR lens that covers a plurality of the solid-state light emitting devices and focuses the light that they emit in a desired direction.

BRIEF DESCRIPTION OF THE DRAWING

The foregoing aspects and many of the attendant advantages of this invention will become more readily appreciated as the same becomes better understood by reference to the following detailed description, when taken in conjunction with the accompanying drawings, wherein:

FIG. 2 is front elevational view showing the tail light assembly of FIG. 1;

FIG. 3 is a top plan view of the tail assembly showing a first embodiment of a connection for electrically coupling the tail assembly to a vehicle electrical wiring system;

FIG. 4 is a top plan view of the tail assembly showing a plurality of connector pins usable for electrically coupling the tail assembly to a vehicle electrical wiring system;

FIG. 5 is a top plan view of the tail assembly showing a plurality of connector contacts usable for electrically coupling the tail assembly to a vehicle electrical wiring system;

FIG. 6 is an enlarged cross-sectional view of the tail assembly of FIG. 4;

FIG. 7 is a front elevational view of a vehicle that includes a light bar, head lights, and side running lights in accord with the present invention;

FIG. 8 is a cross-sectional view of a head light showing a totally internally reflecting (TIR) lens used for focusing the light emitted by the plurality of solid-state light sources;

FIG. 9 is a cross-sectional view of a row of solid-state light sources, showing a TIR lens on each light source;

FIG. 10 is an enlarged cross-sectional view of a "high beam" solid-state light source and a "low beam" solid-state light source as used in the head light;

DESCRIPTION OF THE PREFERRED EMBODIMENT

Figure 1:
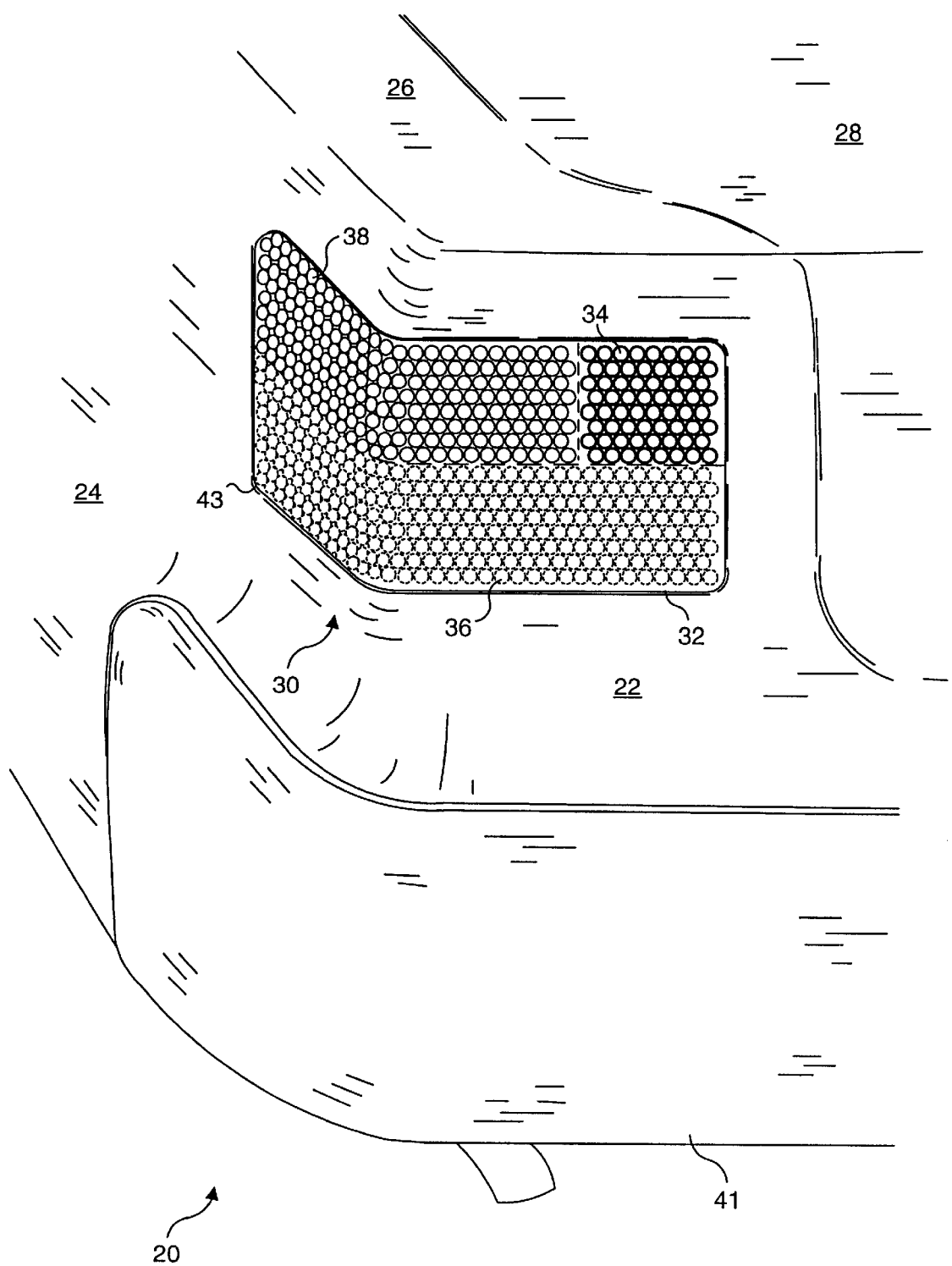
FIG. 1 is an isometric view of a left rear portion of a vehicle, such as an automobile, showing a plurality of solid-state light sources mounted on a flexible substrate in accord with the present invention, being used as a tail light assembly that produces different colors of light.

As shown in an exemplary application illustrated in FIG. 1, the present invention is configured as a tail light assembly 30, which is mounted on a vehicle left rear end 20. While many other configurations are possible, for use with the various brands and models of vehicles that change periodically, FIG. 1 illustrates only an exemplary application of the present invention. Shown in this Figure are a left rear surface 22 of the vehicle, portions of a left rear quarter panel side surface 24, a left rear quarter panel top surface 26, and a portion of a trunk lid 28.

Tail light assembly 30 is attached to left rear surface 22 and wraps around a curved defined between that surface onto left rear quarter panel side surface 24. The tail light assembly includes a flexible substrate 32 on which are mounted a plurality of light emitting devices grouped together on the basis of the color of light that they emit. Thus, in this example, a group 34 of the light emitting devices emit white light and are energized when the vehicle is backing up, to illuminate the surface over which the vehicle is backing. A group 36 of the light emitting devices that emit red light are energized each time that a brake pedal (not shown) within the vehicle is depressed to slow or stop the vehicle. Finally, a group 38 of the light emitting devices that produce amber light are energized as running lights to show the location of the vehicle and are caused to periodically flash on and off or blink when the user operates a turn signal lever (not shown) to indicate that the vehicle is going to be driven in a left turn. Further, group 38 of the light emitting devices is energized in a periodic flashing pattern if an emergency flasher switch (not shown) is activated by the operator of the vehicle.

Each of the groups of light emitting devices noted above preferably comprises a plurality of light emitting diodes (LEDs) that is selectively energized by application of an electrical current provided by the electrical system on the vehicle. To protect the groups of light emitting devices from abrasion and other adverse consequences arising from exposure to the environment, an optically transparent cover 40 is secured over the tail light assembly so that the cover is almost flush with the tops of the light emitting devices. Cover 40 is also relatively flexible and is preferably fabricated from a polymeric plastic having suitable optical properties. It is also contemplated that the different groups of light emitting devices producing only white light could alternatively be used and where each different group is shown in FIG. 1, an appropriate coloring can be included within the flexible cover so that light of the appropriate color, i.e. white, red, and amber, will be emitted from the tail light assembly when the corresponding group of light emitting devices is energized. A disadvantage to coloring different portions of cover 40 to achieve the desired color for each group of light emitting devices is that the overall cost of the tail light assembly will be somewhat greater. Although LEDs are used for the light emitting devices in the preferred embodiment, it will be understood by those of ordinary skill in the art that laser diodes and other solid-state light emitting devices can alternatively be used.

An important benefit of the present invention is its ability to conform to an exterior surface of a vehicle as shown in FIG. 1. Preferably, a shallow recess 43 is optionally provided in the exterior surface of the vehicle to define the disposition of tail light assembly 30, and the recess need be only a few millimeters in depth. Use of such a relatively shallow recess will enable the outer surface of the optically transparent cover to be substantially flush with the exterior surface of the vehicle. However, due to the relative thinness of the tail light assembly, it can alternatively be applied to a non-recessed portion of the exterior surface of the vehicle. In any case, tail light assembly 30 does not require any internal space within the trunk, as do conventional tail light assemblies that include incandescent bulbs mounted in reflector assemblies.

FIG. 2 illustrates tail light assembly 30 before it is conformed to fit around the left rear corner of the vehicle. As shown in this Figure and also in FIGS. 3 though 6, the flexible substrate 32 is generally planar before it is applied to and conformed around the exterior surface of the vehicle. Due to its inherent flexibility, since it is made of a flexible polymer, the flexible substrate and the tail light assembly in which it is included are able to readily bend around even relatively sharp corners on the exterior surface of the vehicle, readily conforming to non-planar configurations of such a surface.

FIGS. 3 though 5 illustrate three different embodiments for coupling tail light assembly 30 to the electrical system of the vehicle. Also, these Figures illustrate the relative thinness of the tail light assembly 30, and of corresponding tail light assemblies 30' and 30". With reference to FIG. 3, the different groups of light emitting devices are coupled to the vehicle electrical system through leads 42, which terminate in a connector 44. Connector 44 is intended to couple with a corresponding mating connector (not shown) on the wiring harness provided on vehicle 30, and would typically be disposed inside the trunk of the vehicle, behind internal trim surfaces (not shown) of the trunk.

In FIG. 4, tail light assembly 30' is provided with four connector pins 46 that are adapted to mate with a corresponding female connector that would be mounted within the trunk of the vehicle, behind the internal trim surface. Connector pins 46 are intended to extend through a slot or corresponding spaced-apart apertures (neither shown) provided in the sheet metal exterior surface of the vehicle at the point where the connector pins are disposed. Connector pins 46 may optionally be provided with an insulating collar (not shown) to prevent them from electrically shorting by contact with this sheet metal. Finally, in FIG. 5, tail light assembly 30" includes a plurality of electrical contacts 48 that form an electrical connection with corresponding contacts (not shown) that would be provided in a fixed electrical termination exposed in the center of a slot in the sheet metal of the exterior surface of the vehicle so that the three different groups of solid-state light emitting devices can be energized with the electrical current supplied by the electrical system of the vehicle. Of the three different embodiments shown for coupling the tail light assembly to the electrical system, FIG. 3 represents the most preferred embodiment, since by using this embodiment when mounting the tail light assembly to the vehicle, there is little need for alignment of the connector pins shown in FIG. 4 or of the contacts shown in FIG. 5 with a corresponding connector or contacts on the vehicle. Each of the other exterior light assemblies disclosed below are also prospectively coupled to the electrical system of a vehicle using any of the three different approaches shown in FIGS. 3 through 5, or other suitable electrical connections.

Referring now to FIG. 6, tail light assembly 30' is illustrated. In this view, an adhesive layer 50 applied to the rear surface of flexible substrate 32 is evident. Also illustrated in FIG. 6 is an internal flexible conductive trace 52 and a plurality of vias 54 that are used for connecting each of a plurality solid-state light emitting devices 38 to internal flexible conductive trace 52. Further details of the electrical connection used in several different embodiments of the present invention for connecting each of the light emitting devices to a corresponding flexible electrical trace either on the surface of or internally within flexible substrate 32 are discussed below.

FIG. 7 illustrates a vehicle 60 having a front end 62 on which several other examples for applications of the present invention are illustrated. A front bumper 64 includes a light bar 66 that extends around the curve of the bumper. Light bar 66 includes a flexible substrate 68 on which are mounted a plurality of light emitting devices 70. The light emitting devices are protected by an optically transparent flexible cover 72 that is fitted over flexible substrate 68. It should also be noted that light bar 66 could alternatively be located at other locations on front 62 of vehicle 60. For example, light bar 66 be disposed either in the front grill of the vehicle or below the grill.

Light bar 66 can be used either as an auxiliary light source for illuminating the roadway under foggy conditions. Alternatively, light bar 66 can be used in place of two conventional low beam headlamps, to illuminate the road surface over which vehicle 60 is traveling in a forward direction.

Also provided are a pair of turn signal flexible substrates 74 on which are disposed a plurality of solid-state light emitting devices 76 in spaced-apart array. Solid-state light emitting devices 76 preferably emit amber light and can be used to indicate a direction of an intended turn when energized in response to the operator of the vehicle actuating a turn signal switch lever, or in response to an emergency signal switch being actuated, and thereby caused to flash or blink in a periodic manner. A flexible optically transparent cover 78 is provided to protect the plurality of solid-state light emitting devices 76. Preferably, vehicle 60 also includes a pair of head light flexible substrates 80 mounted on the exterior surface, at opposite sides of front 62. A plurality of spaced-apart solid-state light emitting devices 84 and 94 are provided in alternating rows on flexible head lights substrate 82 for use in respectively producing a high beam illumination and a low beam illumination of the road surface. Solid-state light emitting devices 84 and 94 are separately selectively activated with an electrical current provided by the electrical system of vehicle 60. A flexible optically transparent cover 82 is applied over headlamp flexible substrate 80 to protect the solid-state light emitting devices mounted thereon.

At each side of front 62 are disposed a flexible driving light substrate 56 on which are mounted a plurality of solid-state light emitting devices 58. These solid-state light emitting devices are energized to indicate the location of the vehicle while it is parked or for use as running lights. Typically, solid-state light emitting devices 58 emit amber light, but can instead be white light emitting solid-state devices that transmit light through an appropriately colored cover (not shown) to provided the desired amber colored light.

FIG. 8 illustrates a headlamp assembly 81 that includes a plurality of solid-state light emitting devices 84' that are intended to provide only high beam illumination, in the event that light bar 66 is used to provide the low beam illumination of the driving surface. To provide a directional control for focusing the light emitted by solid-state light emitting devices 84', a totally internally reflecting (TIR) lens 88 is applied in front of the solid-state light emitting devices. TIR lens 88 includes a plurality of annular ridges 90 on its interior surface, extending around a central convex lens 92.

TIR lenses 88 are well-known to those of ordinary skill in the art, and are described in detail in U.S. Pat. No. 5,404,869, the description and drawings of which are hereby specifically incorporated herein by reference. TIR lens 88 enables the light emitted to be focused and directed as desired, creating a light intensity pattern that conforms to the requirements for the spread and aiming of high beam headlamps on vehicles. TIR lens 88 is held in place by an annular support bracket 86 that surrounds the perimeter of a flexible substrate 80'. It will be understood that head lamp assembly 81 would be used in place of the headlamp shown in FIG. 7 in the event that light bar 66 provides low beam illumination of the road surface.

With reference to FIG. 9, further details of the head lamp assembly shown in FIG. 7 are illustrated. In contrast to the embodiment shown in FIG. 8, flexible substrate 80 in FIG. 9 includes alternating rows of light emitting devices 84 that are angled straight ahead to provide the high beam illumination and light emitting devices 94 that are angled downwardly to produce the low beam illumination of the road surface. Further, unlike FIG. 8 which includes a single TIR lens 88 covering all of the plurality of light emitting devices, in FIG. 9, each light emitting device includes its own TIR lens 100, further details of which are illustrated in FIG. 10.

As shown in FIG. 10, long conductive supports 96 are provided on the top portion of light emitting devices 94 and are substantially longer than short conductive supports 98, which are provided on the bottom portion of these light emitting devices. Each long conductive support 96 is electrically terminated at an internal flexible conductive trace 102 that runs through the interior of flexible substrate 80. A flexible conductive trace (not shown) is also included on the outer surface of flexible substrate 80 to provide an electrical path for electrical current flowing to light emitting devices 94 through short conductive support 98. Light emitting devices 84 include short conductive support 98 on their lower side and an intermediate length conductive support 104 on their upper side, which is also coupled to internal flexible trace 102. As will be apparent from FIG. 10, the light emitted by light emitting devices 94 is focused downwardly by TIR lens 100, while the light emitted by light emitting devices 84 is directed at a more elevated focal point. FIG. 9 illustrates further details of optically transparent flexible cover 82, which covers the plurality of light emitting devices mounted on flexible substrate 80.

Figure 11:
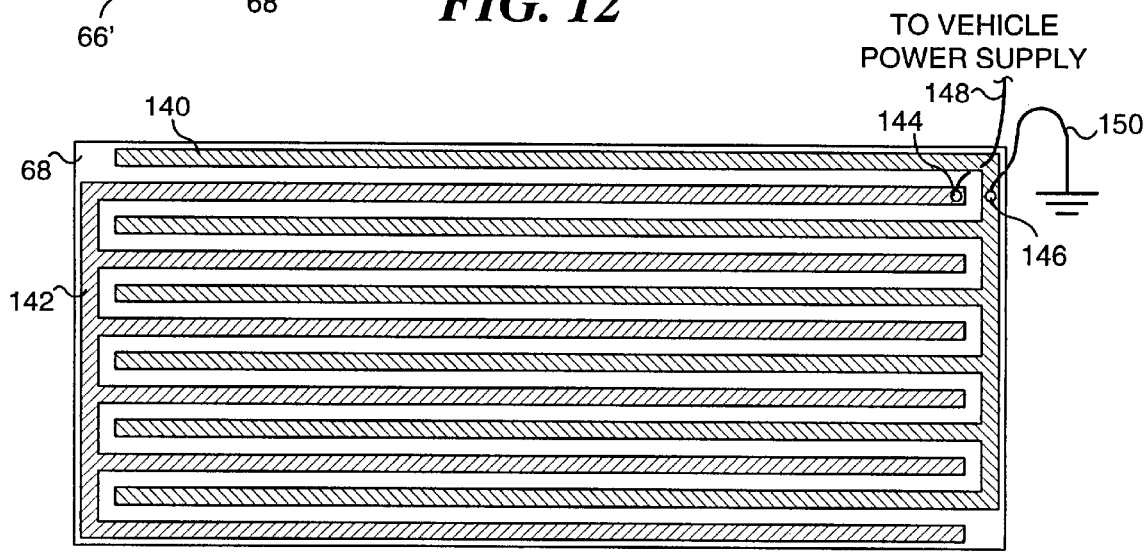
FIG. 11 is a plan view of a flexible substrate, showing conductive traces applied thereto.

FIG. 11 illustrates two flexible conductive traces 140 and 142 that are applied to flexible substrate 68 for use in providing electrical power to the array of light emitting devices used in light bar 66 (as shown in FIG. 7). In the embodiment shown in FIG. 11, each light emitting device is mounted so that one electrical terminal is soldered or connected with a conductive epoxy to either flexible conductive trace 140 or flexible conductive trace 142, and so that the other electrical terminal of the light emitting device is electrically connected to the other of the two flexible conductive traces. A flexible lead 148 is secured to flexible conductive trace 142 by a solder/conductive epoxy drop 144, while a flexible conductive lead 150 is secured to flexible conductive trace 140 by a solder/conductive epoxy drop 146. Flexible lead 150 is preferably connected to the vehicle ground or chassis.

Figure 12:
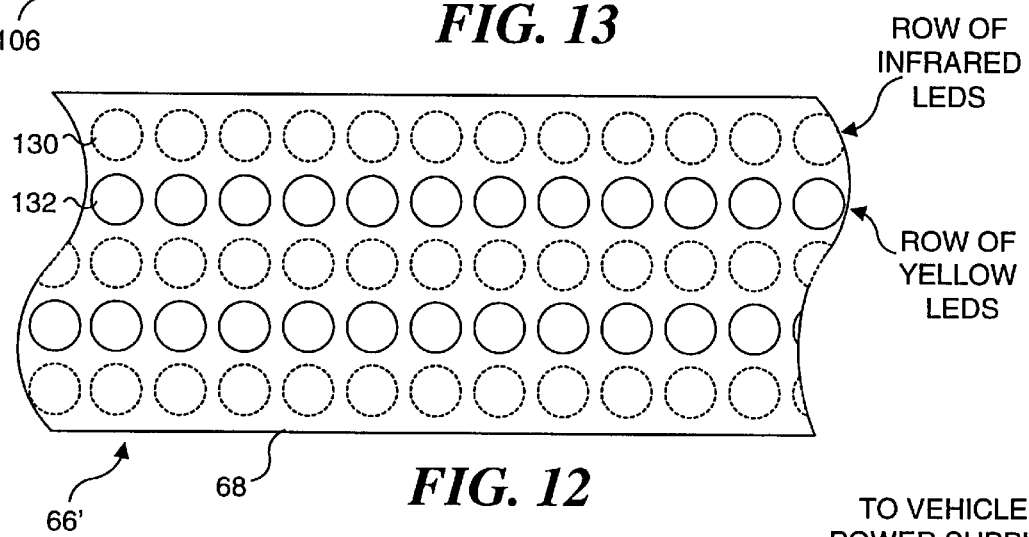
FIG. 12 is a front elevational view of a light bar that includes alternating rows of infrared emitting LEDs and yellow light emitting LEDs.

In FIG. 12, an alternative arrangement for a light bar 66' includes alternating rows of infrared LEDs 130 and yellow LEDs 132. These infrared and yellow LEDs are mounted on flexible substrate 68 and are coupled to flexible traces (not shown in the Figure) that are separately selectively energized so that either infrared light, yellow light, or both infrared and yellow light are emitted by light bar 66'. By energizing infrared LEDs 130 on light bar 66', the driving surface and objects in front of the vehicle can be illuminated with infrared light so that they are visible using appropriate infrared detection equipment in fog or other low visibility ambient conditions. The yellow light emitted by LEDs 132 on light bar 66' can also be useful in providing better illumination during foggy conditions, when yellow light is more readily visible and provides better visibility of the road and objects in the path of the vehicle. Although not shown, a display screen inside vehicle 60 could be employed for viewing objects detected by an infrared sensor. A suitable infrared detector would be a charge-coupled device (CCD) array. The display would provide the driver of the vehicle with a view of objects in the path of the vehicle that would otherwise not be visible in fog or other poor visibility ambient conditions.

Use of the Present Invention with Other Types of Vehicles

Figure 13:
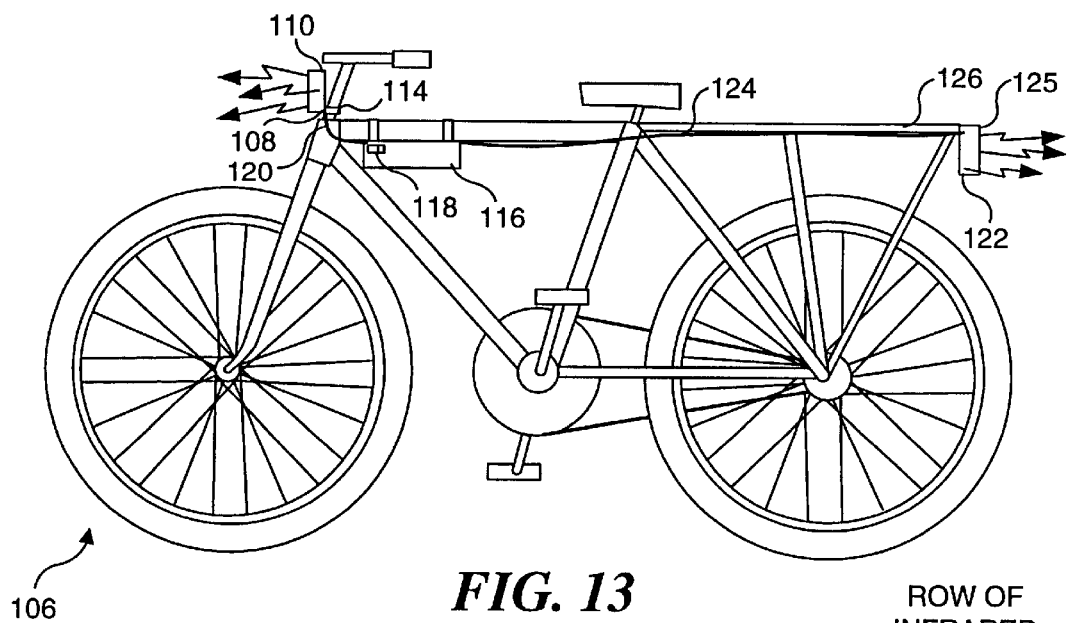
FIG. 13 is a side elevational view of a bicycle having a head light and a tail light that each include a plurality of solid-state light sources mounted on a flexible substrate.

It should be emphasized that in addition to vehicles such as automobiles, the present invention is also applicable in providing exterior lighting for other motorized and non-motorized vehicles, including snowmobiles, motorcycles, bicycles, etc. For example, as shown in FIG. 13, a bicycle 106 includes a flexible substrate 108 in which a plurality of light emitting devices 110 are mounted in spaced-apart array to serve as a head light that is slightly curved to illuminate a wider path in the direction of travel by the bicycle. Flexible substrate 108 is supported by a bracket 114, which is attached to the stem of the bicycle handlebars. Also included on bicycle 106 is a flexible substrate 122 that includes light emitting devices 125, which emit red light, as appropriate for a tail light. Flexible substrate 122 is attached to and supported by a curved rear support 126, which enables the red light to be visible from the sides of the bicycle as well as the rear. Electrical current is supplied from a battery pack 116 to energize light emitting devices 110 through leads 120. Similarly, leads 124 convey electrical current from battery pack 116 to light emitting devices 125. A switch 118 on the side of battery pack 116 is used for controlling activation of the light emitting devices on flexible substrate 108 and on flexible substrate 122.

Figure 14:
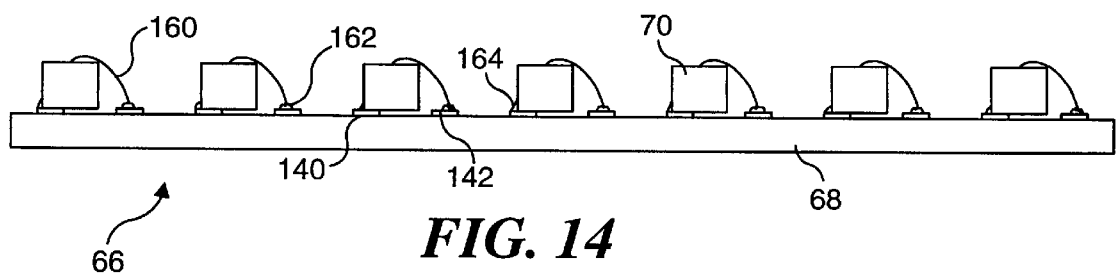
FIG. 14 is a side elevational view of a first approach for connecting solid-state light sources to conductive traces formed on a substrate.

Although many other configurations of leads and conductive traces can be used for electrically connecting light emitting devices to flexible conductive traces disposed on the surface or internally in a flexible substrate, FIGS. 14 through 17 illustrate several preferred embodiments of such configurations. FIG. 14 illustrates light bar 66, which includes flexible conductive traces 140 and 142 running parallel along the outer surface of flexible substrate 68, as described above. Each light emitting device 70 includes a fly wire 160 that extends from the top electrical terminal of each light emitting device to a solder/conductive epoxy connection 162 on flexible conductive trace 142. Furthermore, the other electrical terminal, which is disposed on the side of light emitting device 70, is connected to each of the flexible conductive traces 140 with a droplet of solder/conductive epoxy 164. It will be understood that other types of electrically conductive bonding material can alternatively be used for electrically connecting any of the light emitting devices to any of the flexible conductive traces discussed herein.

Figure 15:
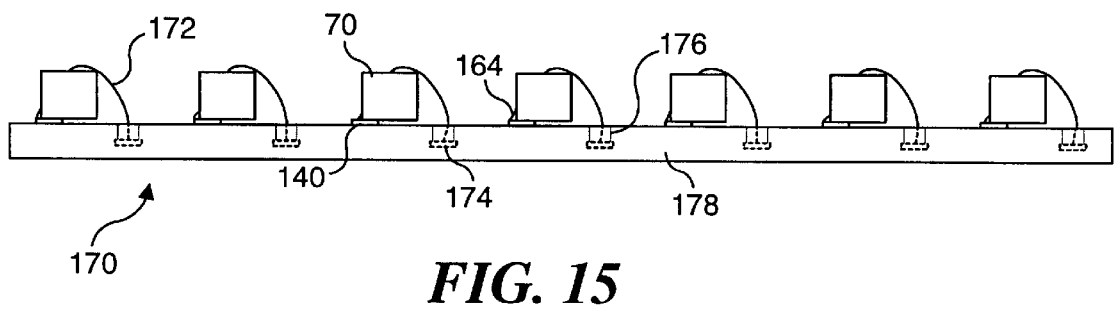
FIG. 15 is a side elevational view of a second approach for connecting solid-state light sources to conductive traces, including one trace that is disposed inside the flexible substrate.
Figure 17:
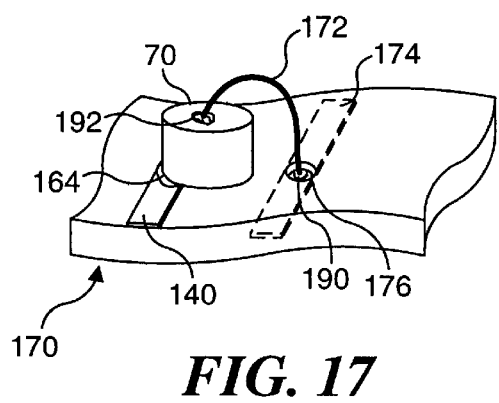
FIG. 17 is an enlarged isometric view of a portion of the flexible substrate and one light source, for the approach shown in FIG. 15.

In FIG. 15, a light bar 170 also includes flexible conductive traces 140 that extend along the outer surface of a flexible substrate 178. However, flexible substrate 170 includes internally disposed flexible conductive traces 174 that extend parallel to flexible conductive traces 140, but at an intermediate depth within the flexible substrate. Fly wires 172 extend from the top electrical terminal of each light emitting device 70 through a via 176 to connect to one of internally disposed flexible conductive traces 174. The side electrical terminals on the light emitting devices are electrically connected to flexible conductive traces 140, as described above in connection with FIG. 14. Further details of light bar 170 are shown in FIG. 17. As will be evident therein, fly wire 172 is connected to the top electrical terminal of light emitting device 170 by a droplet of solder/connective epoxy 192. The other end of fly wire 172 is connected to internally disposed flexible conductive trace 174 with a droplet of solder/conductive epoxy 190.

Figure 16:
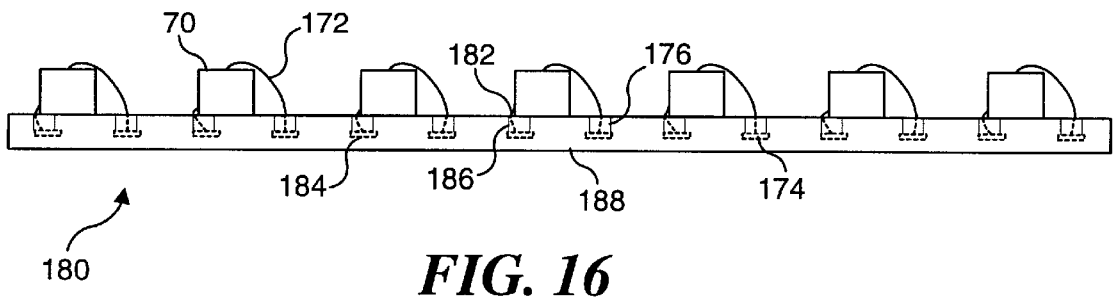
FIG. 16 is a side elevational view of a third approach for connecting solid-state light sources to conductive traces, where both conductive traces are disposed inside the flexible substrate.

FIG. 16 illustrates a third configuration in which a light bar 180 includes a flexible substrate 188 in which are disposed a plurality of parallel-extending internally disposed flexible conductive traces 174 and 184. Vias 176 provide access to internally disposed flexible conductive traces 174, while vias 186 provide access to internally disposed flexible conductive traces 184. As was the case in the embodiment shown in FIG. 15, light bar 180 includes fly wires 172 that extend between the top electrical terminal on light emitting devices 70 and internally disposed flexible conductive traces 174. Similarly, fly wires 182 extend from the side electrical terminals on light emitting devices 70 through vias 186 to electrically connect with internal flexible conductive traces 184.

Clearly, if other types of light emitting devices are used that include electrical terminals in different dispositions than those shown in FIGS. 14 through 17, appropriate changes to the connection of the light emitting devices to the flexible conductive traces used on the flexible substrate must be employed, as will be well understood by those of ordinary skill in the art.

Although the present invention has been described in connection with the preferred form of practicing it, those of ordinary skill in the art will understand that many modifications can be made thereto within the scope of the claims that follow. Accordingly, it is not intended that the scope of the invention in any way be limited by the above description, but instead be determined entirely by reference to the claims that follow.

The invention in which an exclusive right is claimed is defined by the following:

1. A flexible vehicular light source adapted to mount on and conform to a shape of an external surface of a vehicle and to emit light that provides illumination of a surface over which the vehicle is traveling, indicates an intention of a driver to turn or stop the vehicle, and/or provides an indication of a location of the vehicle, said flexible vehicular light source comprising:
   (a) a flexible substrate having a rear surface and a front surface, and including a plurality of flexible conductive traces, said plurality of flexible conductive traces being adapted to connect to an electrical system of a vehicle to receive an electrical current therefrom, said plurality of flexible conductive traces being disposed in at least one of the following locations:
      (i) on the rear surface of the flexible substrate;
      (ii) on the front surface of the flexible substrate; and
      (iii) within an internal portion of the flexible substrate;
   (b) a plurality of solid-state light emitting devices mounted in a spaced-apart array on the front surface of the flexible substrate, said array extending in two orthogonal directions, said plurality of solid-state light emitting devices being electrically connected to the plurality of flexible conductive traces and energized by the electrical current, emitting light outwardly and away from said flexible substrate; and
   (c) a transparent flexible envelope that extends over the plurality of solid-state light emitting devices, providing protection against abrasion, the light emitted by the plurality of solid-state light emitting devices passing through the transparent flexible envelope, said transparent flexible envelope not covering the rear surface of the flexible substrate, so that the rear surface of the flexible substrate is adapted to mount on an exterior surface of a vehicle, said flexible substrate, said spaced-apart array, and said transparent flexible envelope being able to conform to a non-planar curve of the exterior surface.

2. The flexible vehicular light source of claim 1, further comprising a plurality of internally reflective surfaces, each disposed proximate a different one of the plurality of solid-state light emitting devices, said internally reflective surfaces focusing the light emitted by the plurality of solid-state light emitting devices in a desired direction, away from the front surface of the flexible substrate.

3. The flexible vehicular light source of claim 1, further comprising an adhesive applied to the rear surface of the flexible substrate for use in adhesively attaching the flexible substrate to the exterior surface of the vehicle.

4. The flexible vehicular light source of claim 1, wherein the plurality of solid-state light emitting devices are arrayed in a plurality of groups, the solid-state light emitting devices in each group emitting light having a different waveband than those in an adjacent group.

5. The flexible vehicular light source of claim 4, wherein the solid-state light emitting devices in a first group emit white light, the solid-state light emitting devices in a second group emit red light, and the solid-state light emitting devices in a third group emit amber light, said vehicular light source being thereby adapted to mount on a rear portion of a vehicle.

6. The flexible vehicular light source of claim 1, wherein at least a portion of the solid-state light emitting devices in a first group emit infrared light.

7. The flexible vehicular light source of claim 1, wherein at least a portion of the solid-state light emitting devices in a first group emit yellow light.

8. The flexible vehicular light source of claim 1, wherein said vehicular light source includes a plurality of different groups of the solid-state light emitting devices that are separately selectively energizable, and wherein the transparent flexible envelope overlying the different groups is divided into different areas that are colored to transmit light of differing colors when each group of solid-state light emitting devices is selectively energized.

9. The flexible vehicular light source of claim 1, wherein the plurality of light sources emit white light and the flexible vehicular light source is adapted to be mounted on a front exterior surface of a vehicle, to illuminate a surface over which the vehicle may advance.

10. The flexible vehicular light source of claim 1, further comprising a totally internally reflective (TIR) lens that covers at least a portion of the plurality of solid-state light emitting devices, said TIR lens focusing the light emitted thereby in a desired direction.

11. The flexible vehicular light source of claim 1, further comprising a totally internally reflective (TIR) lens for each of the plurality of solid-state light emitting devices, said TIR lenses focusing the light emitted by the plurality of solid-state light emitting devices away from the front surface, in a desired direction.

12. The flexible vehicular light source of claim 1, wherein the flexible substrate is adapted to mount within a recess formed in the exterior surface of the vehicle.

13. A flexible light emitting panel for application to an exterior surface of a vehicle, comprising:
   (a) a flexible substrate sized and shaped to cover a selected portion of an exterior surface of a vehicle, said flexible substrate including a positive flexible conductive trace and a negative flexible conductive trace, each flexible conductive trace being adapted to couple to an electrical system of a vehicle to receive an electrical current,
   (b) a plurality of solid-state light emitting devices mounted on at least a defined portion of an outer surface of the flexible substrate in a spaced-apart array extending in two orthogonal directions, an anode of each solid-state light emitting device being electrically connected to the positive flexible conductive trace and a cathode of each solid-state light emitting device being electrically connected to the negative flexible conductive trace so that an electrical current conveyed thereby is applied to energize each of the plurality of solid-state light emitting devices, the plurality of solid-state light emitting devices so energized thereby emitting light outwardly and away from said flexible substrate;
   (c) a flexible protective, generally light transmitting cover overlying said plurality of solid-state light emitting devices, but not overlying a rear surface of said flexible substrate, said flexible substrate on which the solid-state light emitting devices are mounted and said flexible protective cover comprising a flexible panel that is adapted to be affixed to and conform to the exterior surface of a vehicle, even though the exterior surface is non-planar, producing light when the solid-state light emitting devices are energized by the electrical current.

14. The flexible light emitting panel of claim 13, wherein the plurality of solid-state light emitting devices are grouped in regard to a color of light emitted thereby, said plurality of solid-state light emitting devices comprising a plurality of groups, each group emitting light of a different color.

15. The flexible light emitting panel of claim 14, wherein the flexible panel includes a first group of solid-state light emitting devices that emit white light, a second group of solid-state light emitting devices that emit red light, and a third group of solid-state light emitting devices that emit amber light, said flexible panel comprising a tail light assembly for a vehicle.

16. The flexible light emitting panel of claim 13, wherein the flexible panel is elongate and is adapted to be mounted on a front surface of a vehicle.

17. The flexible light emitting panel of claim 13, further comprising a plurality of lenses, each lens focusing the light emitted by a different one of the plurality of solid-state light emitting devices in a predefined direction that is generally oriented away from the flexible substrate.

18. The flexible light emitting panel of claim 13, further comprising a plurality of totally internally reflective (TIR) lenses, each TIR lens reflecting the light emitted by a different one of the plurality of solid-state light emitting devices in a predefined direction that is generally oriented away from the flexible substrate.

19. The flexible light emitting panel of claim 13, wherein the plurality of solid-state light emitting devices are electrically coupled to each flexible conductive trace with one of a solder and a conductive adhesive.

20. The flexible light emitting panel of claim 13, wherein at least one of the anode and the cathode of each of the plurality of solid-state light emitting devices is connected to a corresponding one of the positive and negative flexible conductive traces using a flexible lead.

21. The flexible light emitting panel of claim 13, further comprising a totally internally reflective (TIR) lens that covers at least a portion of the plurality of solid-state light emitting devices, said TIR lens focusing the light emitted thereby in a desired direction.

22. The flexible light emitting panel of claim 13, wherein the flexible substrate is adapted to mount within a recess formed in the exterior surface of the vehicle.

23. A method for providing external lighting for a vehicle, comprising the steps of:
   (a) providing a flexible substrate having an electrical conductor adapted to couple to a source of electrical power on a vehicle, said flexible substrate having an upper surface and a lower surface, the electrical conductor being disposed in at least one of the following locations:
      (i) on the lower surface of the flexible substrate;
      (ii) on the upper surface of the flexible substrate; and
      (iii) within an internal portion of the flexible substrate;
   (b) mounting a plurality of solid-state light emitting devices in a spaced-apart array on the upper surface of the flexible substrate, so that the plurality of solid-state light emitting devices are coupled to the electrical conductor, light emitted from the plurality of light sources when they are energized being directed outwardly and away from the flexible substrate;
   (c) protecting the plurality of solid-state light emitting devices with a flexible, generally light transmissive cover that overlies the array of solid-state light emitting devices and also conforms to the exterior, so that the flexible cover does not overlie the lower surface of the flexible substrate; and
   (d) attaching the lower surface of the flexible substrate to an external surface of the vehicle, so that the flexible substrate and the flexible generally light transmissive cover conform to even a non-planar shape of the external surface.

24. The method of claim 23, further comprising the step of providing mounting means for affixing the flexible substrate to an exterior surface of a vehicle.

25. A multi-layer flexible vehicular light source adapted to mount on and conform to a shape of an external surface of a vehicle and to emit light that provides illumination of a surface over which the vehicle is traveling, indicates an intention of a driver to turn or stop the vehicle, and/or provides an indication of a location of the vehicle, said flexible vehicular light source comprising:
   (a) a first flexible layer comprising a flexible substrate having a rear surface, a front surface, and a plurality of edge surfaces, such that a surface area of both said rear surface and said front surface are each individually substantially larger than a surface area of any of said edge surfaces, said flexible substrate including a plurality of flexible conductive traces, said plurality of flexible conductive traces being adapted to connect to an electrical system of a vehicle to receive an electrical current therefrom;
   (b) a second flexible layer comprising a plurality of solid-state light emitting devices mounted in a spaced-apart array on the front surface of the flexible substrate, said array extending in two orthogonal directions, said plurality of solid-state light emitting devices being electrically connected to the plurality of flexible conductive traces and energized by the electrical current, thereby emitting light outwardly and away from the front surface of the flexible substrate; and (c) a third flexible layer comprising a transparent flexible envelope that extends over the plurality of solid-state light emitting devices, and which does not cover the rear surface of the flexible substrate, providing protection against abrasion, the light emitted by the plurality of solid-state light emitting devices passing through the transparent flexible envelope, each flexible layer having sufficient flexibility that when all three flexible layers are combined to achieve the multi-layered flexible vehicular light source, the resulting multi-layered flexible vehicular light source is sufficiently flexible to conform to a substantially non-planar surface.

26. A multi-layered flexible vehicular light source adapted to mount on and conform to a shape of an external surface of a vehicle and to emit light that provides illumination of a surface over which the vehicle is traveling, indicates an intention of a driver to turn or stop the vehicle, and/or provides an indication of a location of the vehicle, said flexible vehicular light source comprising:

(a) a first flexible layer comprising a flexible substrate having a rear surface, a front surface, and a plurality of edges, such that a surface area of both said rear surface and said front surface are each individually substantially larger than a surface area of any of said edges, said flexible substrate including a plurality of flexible conductive traces, said plurality of flexible conductive traces being adapted to connect to an electrical system of a vehicle to receive an electrical current therefrom;

(b) a second flexible layer comprising a plurality of solid-state light emitting devices mounted in a high density array on the front surface of the flexible substrate, said high density array having a size and shape substantially similar to a size and shape of the front surface of the flexible substrate, such that substantially all of the front surface of the flexible substrate is covered by the plurality of solid-state light emitting devices, the plurality of solid-state light emitting devices being electrically connected to the plurality of flexible conductive traces and energized by the electrical current, emitting light outwardly and away from the front surface of the flexible substrate; and (c) a third flexible layer comprising a transparent flexible envelope that extends over the plurality of solid-state light emitting devices, but which does not cover the rear surface of the flexible substrate, providing protection against abrasion, the light emitted by the plurality of solid-state, light emitting devices passing through the transparent flexible envelope, each flexible layer having sufficient flexibility that when all three flexible layers are combined to achieve the multi-layered flexible vehicular light source, the resulting multi-layered flexible vehicular light source is sufficiently flexible to be able to conform to a substantially non-planar surface.

* * * * *

(12) INTER PARTES REEXAMINATION CERTIFICATE (604th)
United States Patent
Chen et al.

(10) Number: US 6,520,669 C1
(45) Certificate Issued: May 23, 2013

(54) FLEXIBLE SUBSTRATE MOUNTED SOLID-STATE LIGHT SOURCES FOR EXTERIOR VEHICULAR LIGHTING

(75) Inventors: James C. Chen, Bellevue, WA (US); Darrin Huston, Enumclaw, WA (US)

(73) Assignee: Effectively Illuminated Pathways, LLC, Plano, TX (US)

Reexamination Request:
No. 95/001,737, Sep. 6, 2011

Reexamination Certificate for:
Patent No.: 6,520,669
Issued: Feb. 18, 2003
Appl. No.: 09/597,931
Filed: Jun. 19, 2000

(51) Int. Cl.
*B60Q 1/26* (2006.01)
*F21S 8/10* (2006.01)
*F21V 7/00* (2006.01)

(52) U.S. Cl.
USPC .......................................................... 362/545

(58) Field of Classification Search
None
See application file for complete search history.

(56) References Cited

To view the complete listing of prior art documents cited during the proceeding for Reexamination Control Number 95/001,737, please refer to the USPTO's public Patent Application Information Retrieval (PAIR) system under the Display References tab.

*Primary Examiner* — Stephen Ralis

(57) ABSTRACT

Exterior lighting assemblies for use on vehicles include a flexible substrate on which are mounted a plurality of solid-state light emitting devices. Preferably, light emitting diodes (LEDs) are used for the solid-state light emitting devices, although other types of devices can alternatively be employed. The light emitting devices are connected to flexible conductive traces provided on the flexible substrate and leads are provided to connect to the power supply on the vehicle so that electrical current can be selectively supplied to energize the light emitting devices. The flexible substrate is adapted to be mounted on the exterior surface of a vehicle, for example, as a tail lamp assembly, or as a headlamp. Light emitting devices that emit different colored light can be used to provide red light to indicate slowing of the vehicle due to braking, amber light for turn signal indication, and white light to illuminate the surface over which the vehicle is traveling. A flexible optically transparent cover protects the light emitting devices. Due to their flexibility, the light assemblies can be conformed around a curved exterior surface of a vehicle.

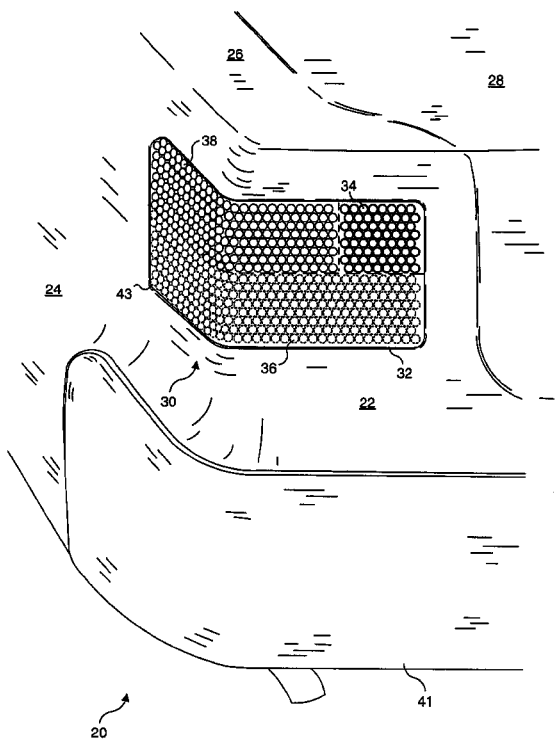

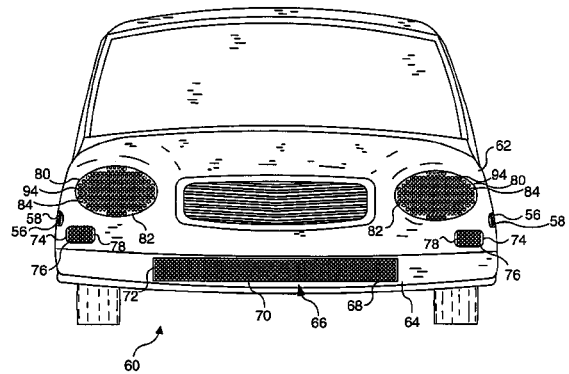

INTER PARTES REEXAMINATION CERTIFICATE ISSUED UNDER 35 U.S.C. 316

THE PATENT IS HEREBY AMENDED AS INDICATED BELOW.

AS A RESULT OF REEXAMINATION, IT HAS BEEN DETERMINED THAT:

Claims 1-26 are cancelled.

\* \* \* \* \*